United States Patent [19]

Groudan et al.

[11] 4,031,374

[45] June 21, 1977

[54] ERROR CORRECTION SYSTEM FOR RANDOM ACCESS MEMORY

[75] Inventors: Alan I. Groudan, Harrington Park; George F. Schroeder; H. Lee Treffinger, both of Wayne, all of N.J.

[73] Assignee: The Singer Company, Little Falls, N.J.

[22] Filed: Dec. 24, 1974

[21] Appl. No.: 536,142

[52] U.S. Cl. .................. 235/153 AM; 250/336; 235/153 AE; 235/153 BN; 307/308; 340/146.1 AG; 340/173 BB; 340/174 ED

[51] Int. Cl.² ............... G11C 29/00; G06F 11/10

[58] Field of Search ............... 102/70.2 R, 70.2 G, 102/70.2 GA; 250/336, 370–371, 388, 390–392, 395; 235/153 AM, 153 AE, 153 BN; 307/308; 330/130; 340/146.1 AG, 173 BB, 174 ED; 360/53; 445/1

[56] References Cited

UNITED STATES PATENTS

| | | | |
|---|---|---|---|
| 3,409,839 | 11/1968 | Crowe | 250/336 X |
| 3,524,999 | 8/1970 | Fletcher et al. | 307/308 |
| 3,533,082 | 10/1970 | Schnabel et al. | 340/172.5 |
| 3,623,014 | 11/1971 | Doelz et al. | 340/172.5 |
| 3,652,877 | 3/1972 | Smith | 307/308 |
| 3,659,275 | 4/1972 | Marshall | 340/172.5 X |
| 3,668,644 | 6/1972 | Looschen | 340/172.5 |
| 3,755,791 | 8/1973 | Arzubi | 340/172.5 X |
| 3,771,143 | 11/1973 | Taylor | 340/172.5 |
| 3,838,261 | 9/1974 | Rice et al. | 235/153 AE |
| 3,876,978 | 4/1975 | Bossen et al. | 340/146.1 AG |

*Primary Examiner*—R. Stephen Dildine, Jr.
*Attorney, Agent, or Firm*—Thomas W. Kennedy

[57] ABSTRACT

An error correction system is provided for a random access memory system of the magnetic core or plated wire type, and which serves to render the memory system immune to the effects of nuclear radiation, and the like. The system of the invention includes circumvent circuitry which serves to limit all currents in the memory access network to safe values during a radiation event, so as to pevent burn-out of the memory and of its associated components. The system of the invention also serves to correct single word errors which can occur to words being written or read during the radiation pulse. The single word error correction is achieved in a first embodiment of the invention by partitioning the fixed data program words in the memory into blocks; by providing an error correction word for each such block, and by reconstructing from the error correction word, the word being read or written during the radiation pulse. This is achieved in the first embodiment of the error correction system by first accessing the affected word, then loading all zeros into the memory address of the affected word, and then reconstructing the effected word by the provision of an "exclusive or" summing means which forms a computed error correction word for the entire block, including the affected word (which is now zeros), plus the original error correction word. The computed error correction word is a reconstruction of the affected data word. A second embodiment of the invention achieves the same correction in the case of the variable data storage portion of the memory, by means of a system which continuously up-dates the error correction word as the variable data in the memory is up-dated. Further embodiments of the invention provide error correction to the variable data words without the use of error correction words.

16 Claims, 11 Drawing Figures

ERROR CORRECTION SYSTEM FOR RANDOM ACCESS MEMORY

BACKGROUND OF THE INVENTION

There do not appear to be any systems in the prior art which provide for error correction for the contents of random access magnetic memories which have been subjected to a nuclear radiation event, and other phenomena that produces an error in a word of memory. Random access memories which must retain vital data, even after being subjected to nuclear radiation while writing or restoring data, can be rendered immune to the radiation effects, by storing small quantities of data doubly or triply redundantly in the memory. This enables a single word loss to be remedied by reference to other error-free copies of the affected word. However, practical limitations on memory sizes prohibits the entire contents of a typical memory from being stored in a double or triple redundant manner.

Data loss may be obviated in a random access memory without the need for redundant storage, in the case of the fixed data, by the use of the plated wire type non-destructive read-out memory. If suitable circumvent circuitry is provided to protect the unaddressed words stored in the plated wire memory, the memory will be safe from the effects of nuclear radiation insofar as the fixed data is concerned. This is because of the non-destructive read-out characteristics of this type of memory. The plated wire memory, therefore, may be used for the storage of fixed data, since under normal operation, the fixed data will be read only from the memory and, due to the non-destructive read-out properties of the memory, any word being read during a nuclear event can be reconstituted from the memory itself. However, the plated wire memory does present problems when used for variable data storage, since it is vulnerable insofar as a word being written into memory is concerned.

Thus, the plated wire memory is not immune to the effects of nuclear radiation which occurs when a particular variable data word is being up-dated, since such a particular data word being written into the plated wire memory during a nuclear event could be lost. Therefore, without further protection, the plated wire memory is not suitable for the storage of variable data.

Moreover, the non-destructive read-out plated wire memory is more costly than the destructive read-out magnetic core type, and significant cost problems arise when the non-destructive read-out type of memory is used for the fixed data storage. The option of using the less expensive destructive read-out memory for fixed data storage presents a problem, however, since it is susceptible to the effects of nuclear radiation on both the words being written into the memory or read from the memory. This is because the destructive read-out characteristics of the magnetic core memory creates the need for restoring data after each readout operation. This makes this type of memory vulnerable to the radiation effects when data is being read from the memory or written into the memory. Redundant storage of all the contents of a destructive read-out magnetic core memory is equally impractical.

The present invention provides various embodiments of an improved system for rendering the destructive read-out magnetic core random access memory immune to the effects of nuclear radiation, and the like, insofar as the loss of fixed or variable data words is concerned. The various embodiments to be described are applicable to the fixed data portion of the memories in which certain invariable, fixed, program data words are stored, and which remain unchanged throughout the entire computer program; and certain embodiments are also applicable to the variable data, or scratch pad, portions of such memories in which variable data words are stored that are subject to up-dating, or other changes, from time to time.

The system of the invention overcomes the most difficult problem of error correction due to nuclear radiation, or other interfering radiation, in the less expensive destructive read-out core memory, and of achieving this result in a relatively simple, economical and straightforward manner.

The basic problem of rendering a random access magnetic memory immune to the effects of nuclear radiation is similar for both the core memory and the plated wire memory. The primary similarity lies in the fact that during a write or restore cycle, it is extremely difficult to control the currents in either memory to the precision required to guarantee a correct write or restore operation. The primary difference between the core and plated wire memories lies in the fact that during the read cycle of a core memory, a read/restore operation is required so that the core member is also susceptible to the effects of nuclear radiation during the read operation, where the plated wire memory is not.

The system of the invention will be discussed in conjunction with a random access core in which each memory element is selected by an X-Y switching matrix, and by an applied inhibit current (I). Such a memory is well known to the art and is described, for example, at page 185, of Volume 4, McGraw Hill Encyclopedia of Science and Technology (1960 Edition).

The protective system of the invention includes circumvent circuitry which responds to the detection of nuclear radiation event to isolate magnetic core random access memory from the effects thereof. The circumvent circuitry enables unaddressed memory locations to be protected. However, it is extremely difficult by circumvent circuitry to control the required currents in the memory should exposure to the nuclear radiation occur during an actual write or read/restore operation. This means that the word being read from the core memory, or written into the memory, during the exposure may be lost. As described, the plated wire memory operates on a non-destructive read-out basis which safeguards a stored word from being destroyed during a read cycle, even if it is being read when a nuclear event occurs. In the case of the magnetic core memory, however, the word desired in each read operation must be restored in a subsequent write operation, so that the affected word may be lost during the presence of nuclear radiation. Thus, additional means must be provided to reconstruct words being accessed during the nuclear event. In the case of the plated wire memory, the additional means is required only to reconstruct a word actually being written into the memory during the nuclear event. In the case of the core memory, however, the corrective measures must be taken with respect to words being read or written during the nuclear event.

The system of the invention, as explained briefly above, in one of its embodiments provides an error correction word for each block of the fixed data words, and this error correction word serves to permit the destructive read-out core memory to meet all the performance and operational requirements of a radiation immune system with respect to the fixed data program storage. A second embodiment of the invention applies the error correction word concept to the variable data storage situation; and a third embodiment applies another error correction technique to the variable data storage.

DETAILED DESCRIPTION OF THE ILLUSTRATED EMBODIMENTS

In order to prevent the unaddressed contents of a random access memory from being altered during a nuclear radiation event, it is necessary to insure that excessive currents will not flow in any of the selection lines of the memory. In general, this means that the sum of all the currents (X, Y, I) through a particular memory element must be held until less than the maximum allowable "half select" current. Circumvent shunt circuits are employed to divert the drive currents from the individual elements of the memory on all three axes, this being achieved by the circuits of FIGS. 1 and 2. These circuits prevent the disturbance of all unaddressed memory elements during a radiation event. In addition, the signal from the radiation detector D1 (FIG. 2) is used to turn off all active circuits immediately after the nuclear radiation pulse to prevent burn-out of the associated circuits and circuit elements. The radiation detector D1 may be of any known type which responds to the presence of nuclear radiation, or the like, above a predetermined threshold to produce an output signal.

Figure 1:
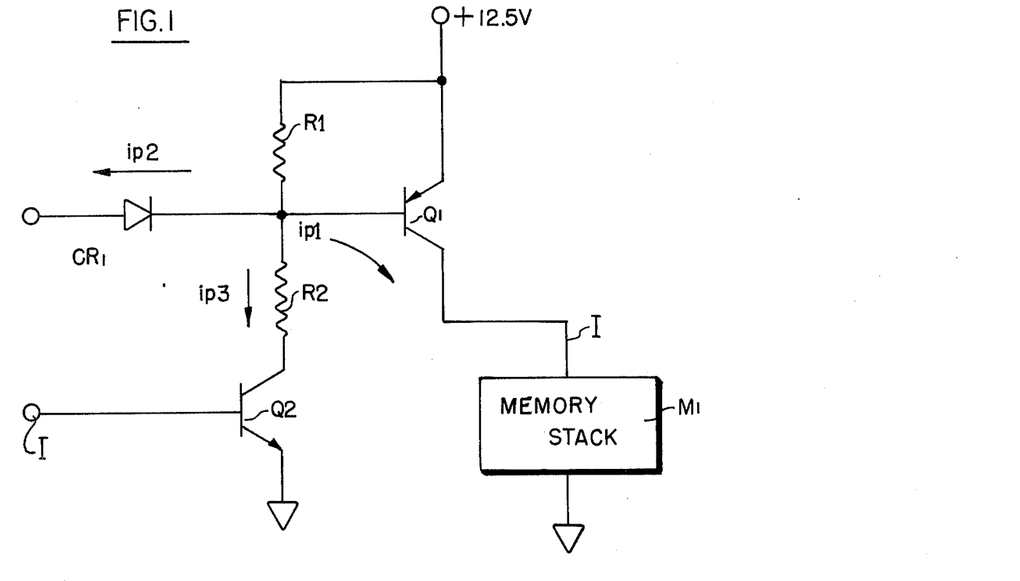
FIG. 1 is a circuit diagram of circuitry for protecting the inhibit portion of a random access memory system from the effects of nuclear radiation.

The circuit of FIG. 1 is incorporated into the drive circuit for the inhibit current I which is controlled to flow through the memory stack to ground, during normal operation of the memory system. The circuit includes a usual grounded emitted NPN transistor Q2 which responds to an inhibit control pulse I applied to its base to become conductive and complete the base circuit of PNP transistor Q1. This causes transistor Q1 to become conductive and to draw the inhibit current through the memory elements in the memory stack M1. The collector of the transistor Q2 is connected to the base of transistor Q1 through a resistor R2, the collector of the transistor Q1 being connected to the inhibit lead of the memory stack M1, and its emitter is connected to the positive terminal of a 12.5 volt source. A resistor R1 is connected to the base of transistor Q1 and to the positive terminal of the 12.5 volt source. The junction of the resistors R1 and R2 is connected to a diode CR1. A fast turn-off pulse is applied to the diode to terminate the inhibit current flow through the memory M1 at the end of the inhibit control pulse.

During a nuclear event, transient leakage currents $ip1$, $ip2$ and $ip3$ flow in the transistor Q1. The resistances of resistors R1 and R2 are reduced to relatively low values to prevent the transistor Q1 from becoming conductive during a nuclear event, and thereby to the current $ip1$ through the memory during the nuclear radiation pulse from reaching an appreciable value.

Figure 2:
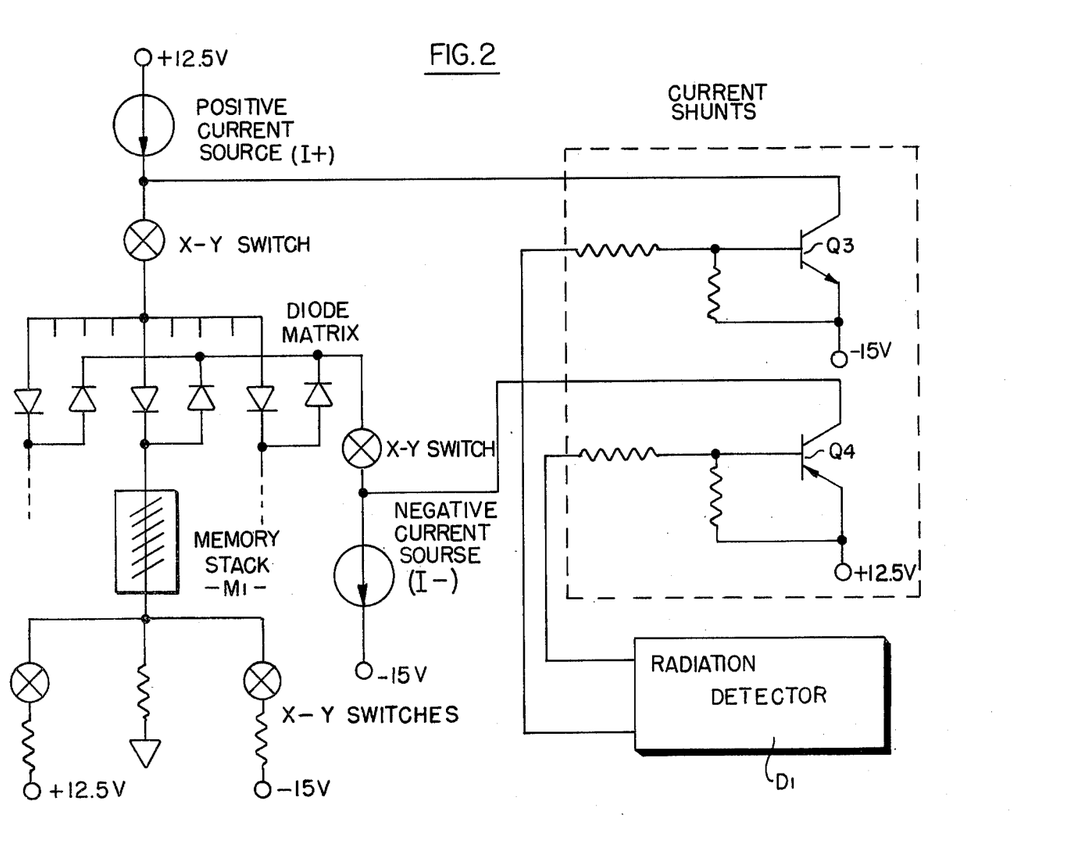
FIG. 2 is a circuit diagram of shunt circuitry for protecting the X-Y selection circuit of a random access memory from the effects of nuclear radiation.

In the case of the circuit of FIG. 2, the circuitry of a pair of transistors Q3 and Q4 provides current shunts around the X-Y switches of the memory selection network. In the event of a nuclear radiation pulse, the resulting signals from the detector D1 renders the transistors Q3 and Q4 conductive, so as to establish shunts around the X-Y switching circuits, and thereby to prevent the selection currents in the memory M1 from rising above a predetermined half-current threshold. The techniques of FIG. 1 or 2 can be applied to either the X-Y or inhibit currents.

Error correction in the case of the word being accessed in the fixed data storage portion of the memory stack M1, as carried out by the first embodiment of the invention, is such that the loss of a single data word from a known location in the fixed data portion of the memory can be reconstructed.

Figure 3:
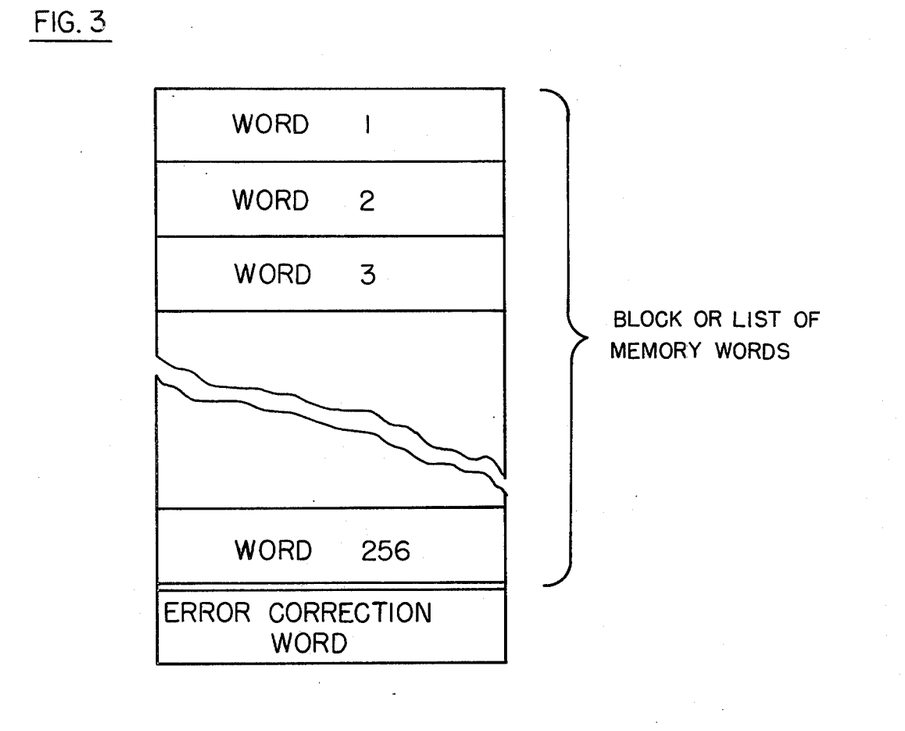
FIG. 3 is a diagram illustrating blocks of fixed data words stored at known addresses in a memory, and also illustrating a corresponding error correction word which is also stored in a memory in which each bit is an "exclusive or sum" bit for the corresponding bits of the various words in the block.

Each block of fixed data words in the fixed data portion of the memory stack M1, such as the block shown in FIG. 3, has a corresponding error correction word. In the correction code illustrated here each bit of the error correction word is an exclusive or sum bit for the corresponding column of bits of the fixed data words in the corresponding block. As pointed out previously two conditions are necessary in order for the word recovery system of this embodiment to achieve its intended purpose. These are that the error must be limited to a single fixed data word, and that the address of the affected fixed data word must be known.

Figure 4:
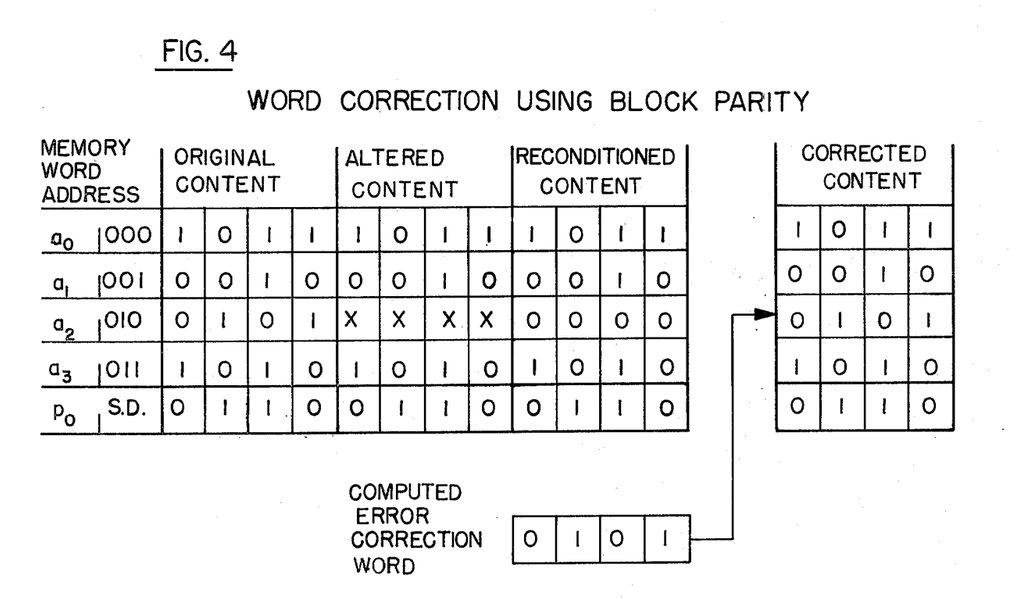
FIG. 4 is a table setting forth an example of word recovery by a first embodiment of the invention, using the error correction word of FIG. 1.

An example of word recovery in the fixed data portion of the random access memory by means of the word recovery system of the first embodiment is shown in the block diagram of FIG. 4, in which the blodk comprises four words, as shown in the "Memory Word Address" column, and in which the four words are located in the fixed data storage portion of the memory at addresses $a_0$, $a_1$, $a_2$ and $a_3$; and in which the address of the error correction word $P_o$ is at any predetermined memory location (S.D.). The block of data shown in the column "Original Content", and the particular block illustrated in FIG. 4 consists of four data words of 4 bits each, followed by the error correction word in which each bit is an even parity of the corresponding column of bits in the block.

Should a nuclear radiation pulse occur during the accessing of the word stored at address $a_2$, it may be assumed that the particular word is lost, as shown in the "Altered Content" column. It should be noted that in the example under consideration, only one word is affected by the radiation pulse, and that the address of the affected word is known. Following the radiation pulse, the affected word is accessed, and it is loaded into memory with all zeros, as shown in the "Reconditioned Content" column. The original word which was affected by the radiation pulse may now be reconstructed by forming a computed error correction word, as an exclusive or sum word of the entire block of data, including the affected word (which is now zeros), plus the original error correction word. This computed error correction word is a reconstruction of the word which was affected by the radiation pulse, as shown in the "Corrected Content" column. Actually, the computed error correction word is the exclusive or sum of the block.

There are several word recovery error correction systems which may be implemented to achieve the desired results of the invention, that is, the recovery of a potentially lost word when a radiation pulse occurs during a write cycle or during a read/restore cycle of a random access memory. Word recovery with respect to the fixed data words may be carried out by the error correction system represented by the first embodiment of the invention. In the first embodiment, all the fixed data memory words are partitioned into blocks in the memory stack, with each block having a corresponding error correction word stored at a convenient address in the memory.

Figure 5:
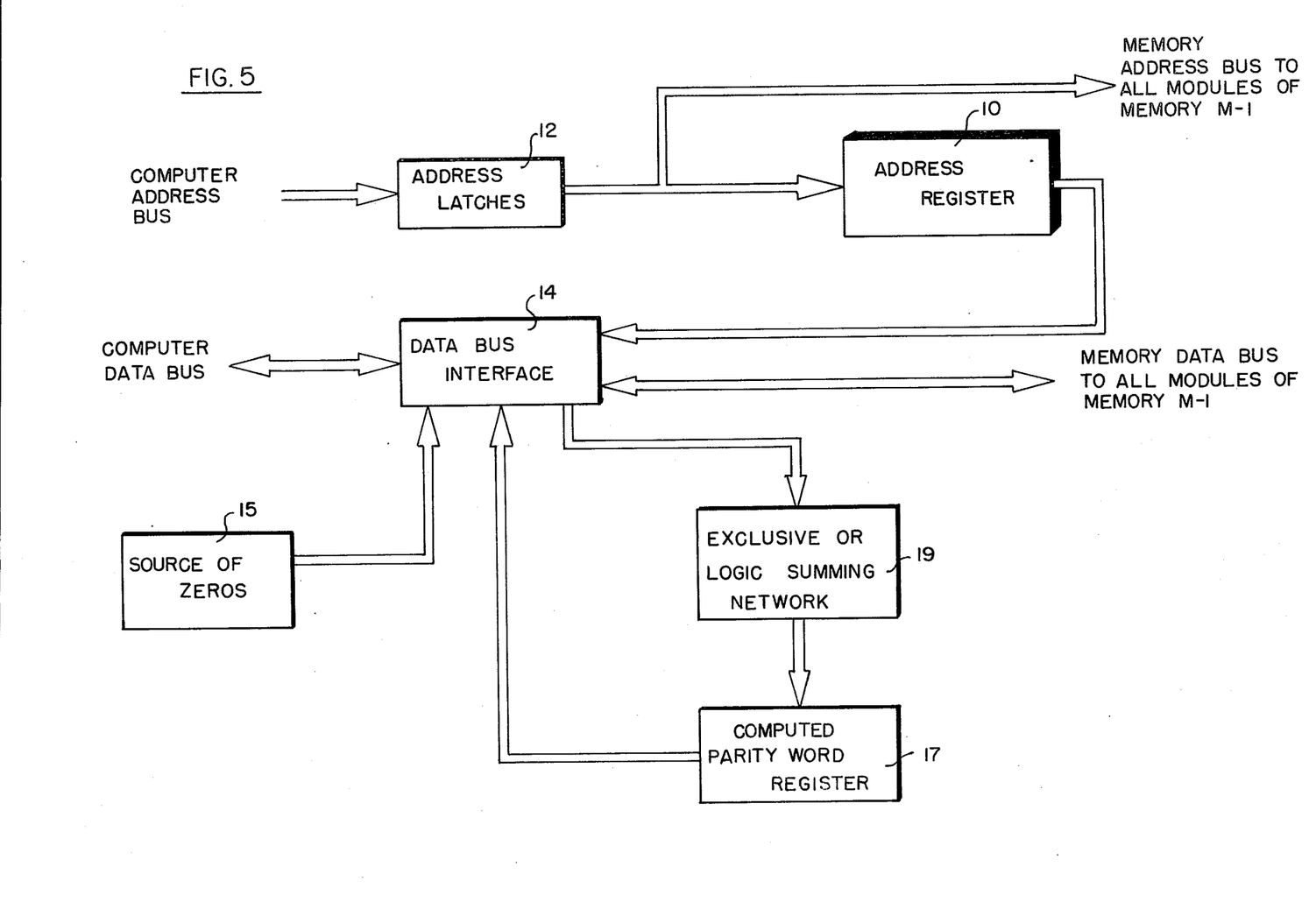
FIG. 5 is a functional block diagram of a first embodiment of the invention, which may be used for word recovery with respect to fixed data words.

The requirement for rendering the fixed data in the memory immune to radiation, in addition to the circumvention circuits of FIGS. 1 and 2, in accordance with the first embodiment, is the provision of a word recovery system which may be represented by the functional block diagram of FIG. 5. The memory circumvention circuitry of FIGS. 1 and 2 assures that only a single memory location can be affected in the presence of a radiation pulse, while the system of FIG. 5 assures the recovery of the potentially lost fixed data word which was being accessed when the radiation pulse occurred.

As pointed out above, a nuclear radiation pulse occuring during a write or a read/restore operation of a random access memory can result in the loss of the word being accessed. All that is required to recover the word by the system of FIG. 5 is that the address of the affected word be known, and that the error correction word be available of the block in which the affected word is located. The error correction word in normally stored in an unused portion of memory and is not accessed until after a nuclear event, hence it will never be altered during an event.

The address of the affected word is held in a hardened address register 10 in the system of FIG. 5. Recovery of the affected word then occurs in the normal radiation recovery routine of the computer, by loading zeros from a source 15 into the memory location designated by the address in register 10. In this way, the affected word is replaced by zeros. The computed error correction word is then formed in a hardened register 17, by feeding all the words in the block containing the affected word, including the affected word itself (which is now zeros), plus the original error correction word (which has been stored in the memory at a normally unused address), through an exclusive or summing network 19 to the hardened register 17. The word formed in the hardened register 17 is a reconstruction of the affected word, and it is introduced into the memory M1 at the memory location of the affected word and replaces the zeros.

During the read/restore operation of a magnetic core memory associated with the system of FIG. 5, each address of the successively accessed words is introduced from the computer bus to the various modules of the memory M1 to a series of latch circuits represented by the block 12. The latch circuits 12 are coupled to the hardened register 10 so that the address of each fixed data word being accessed during a read/restore operation is held in the register 10, while the corresponding data word, applied to the data bus interface circuitry 14 during the operation, is processed. Then, should a radiation pulse occur during the processing of any such fixed data word, its address is preserved in the hardened register 10, so that the above-described word reconstruction operation can be carried out. The hardened registers 10 and 17 can be formed of any suitable semiconductor, magnetic or other device which will not be altered by the maximum radiation.

The system shown in FIG. 5, and the discussion up to this point in the specification, presumes accessing fixed field data from the fixed data portion of the memory. A system for implementing word recovery for the variable data words is shown as a second embodiment of the invention in the functional block diagram of FIG. 6. The system of FIG. 6 includes the hardened address register 10 of FIG. 5, as well as the address latch circuits 12, the data bus interface 14, and the additional blocks 15, 17 and 19. In addition, the system of FIG. 6 includes a data input register 20, a data output register 22, exclusive or logic 26.

Figure 6:
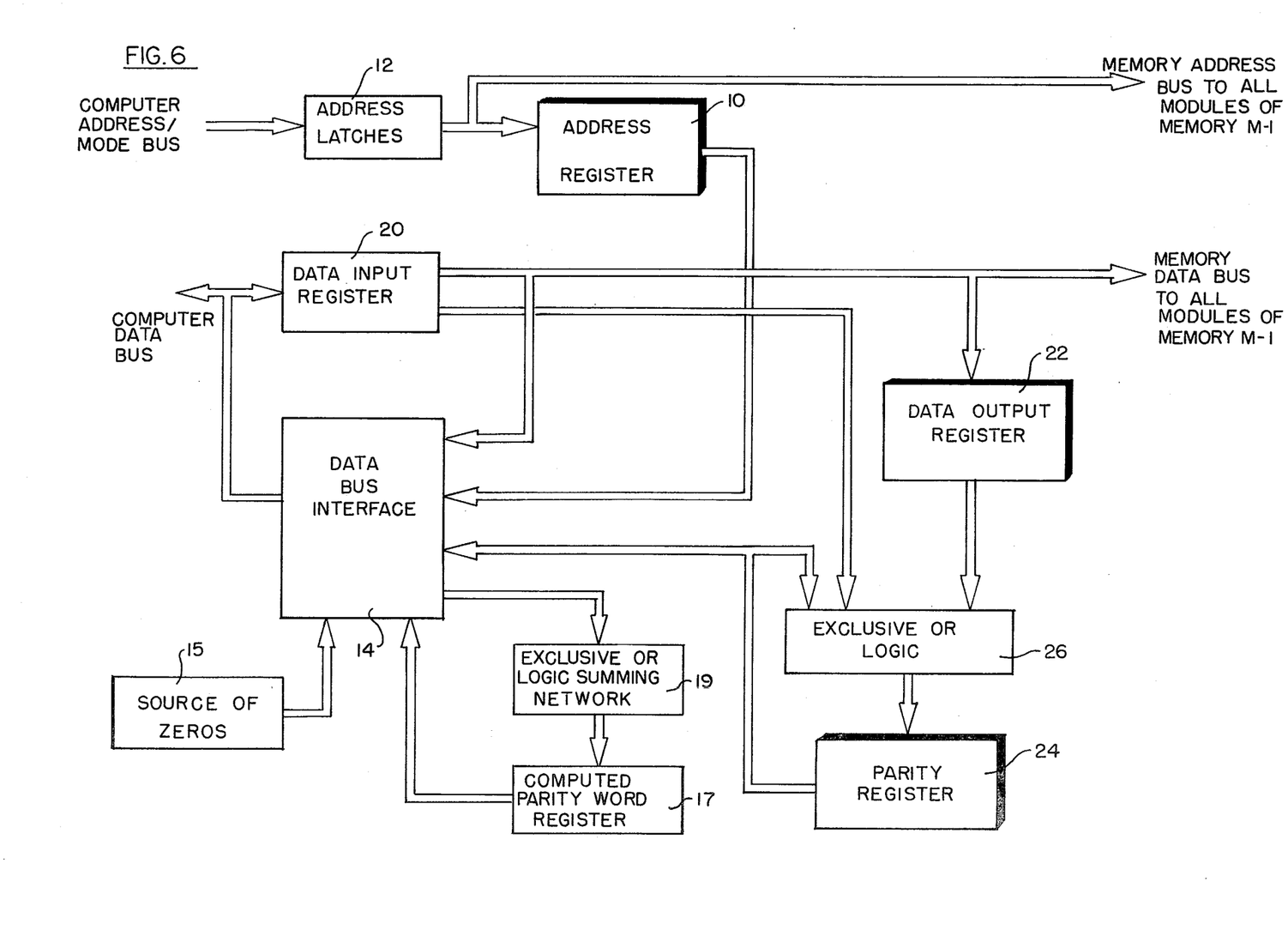
FIG. 6 is a functional block diagram of a second embodiment of the invention, in which the error correction word is continuously up-dated for use in reconstituting variable data words affected during a nuclear event.

The variable data word reconstruction system, as represented by the functional block diagram of FIG. 6, is interposed between the computer data and address buses and the memory M1, and it permits the retention in hardened address register 10 of the memory address of the word being accessed, this address being retained for the duration of the accessing cycle. The memory circumvention circuitry described above assures that only a single memory location can be affected by a radiation pulse, and the hardened address register 10 assures retention of the address of the affected data word. The input and output data registers 20 22, in conjunction with the exclusive or logic 26 and Delta correction word register 24, provide the capability to up-date continuously the hardened computed error correction register 17 for the variable data words. The system of FIG. 6 operates in the same manner as the system of FIG. 5, after a nuclear radiation event to use the up-dated error correction word to reconstruct the affected word.

It should be noted that it is necessary to change the error correction word in two steps because it is affected by the removal of one data word and its replacement by another in the data block.

The hardened computed error correction word register 17 in the system of FIG. 6 is a double register which is alternately up-dated so that one register is not up-dated until the other has been set so that radiation occurring during the up-date cycle will not destroy the correction word.

The radiation recovery operation may be controlled by a sub-routine of the computer as a part of the normal radiation recovery operation of the computer. The recovery action to be taken is dependent upon whether a read/restore or clear/white cycle is in process when the radiation event occurs, and on the portion of the cycle in which the radiation event occurred. The final mechanication for the variable data does not affect the recovery operations for the fixed data portion of the memory. Action taken for the variable data portion of the memory depends upon the existence of a proper up-dated error correction word from the hardened register 17 of the system of FIG. 6.

Figure 7:
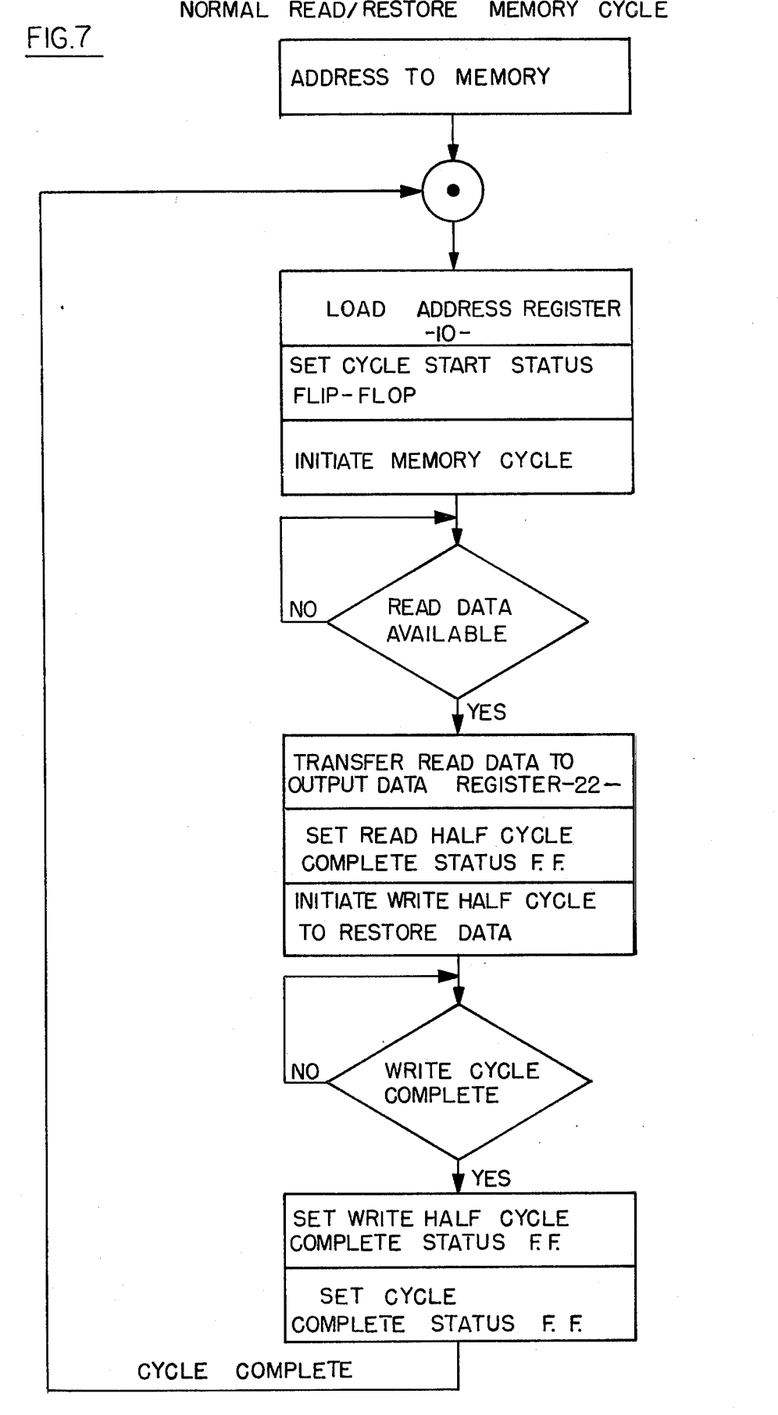
FIGS. 7, 8 and 9 are flow diagrams of various routines which may be instituted to carry out the word recovery action by the system of FIG. 6.
Figure 8:
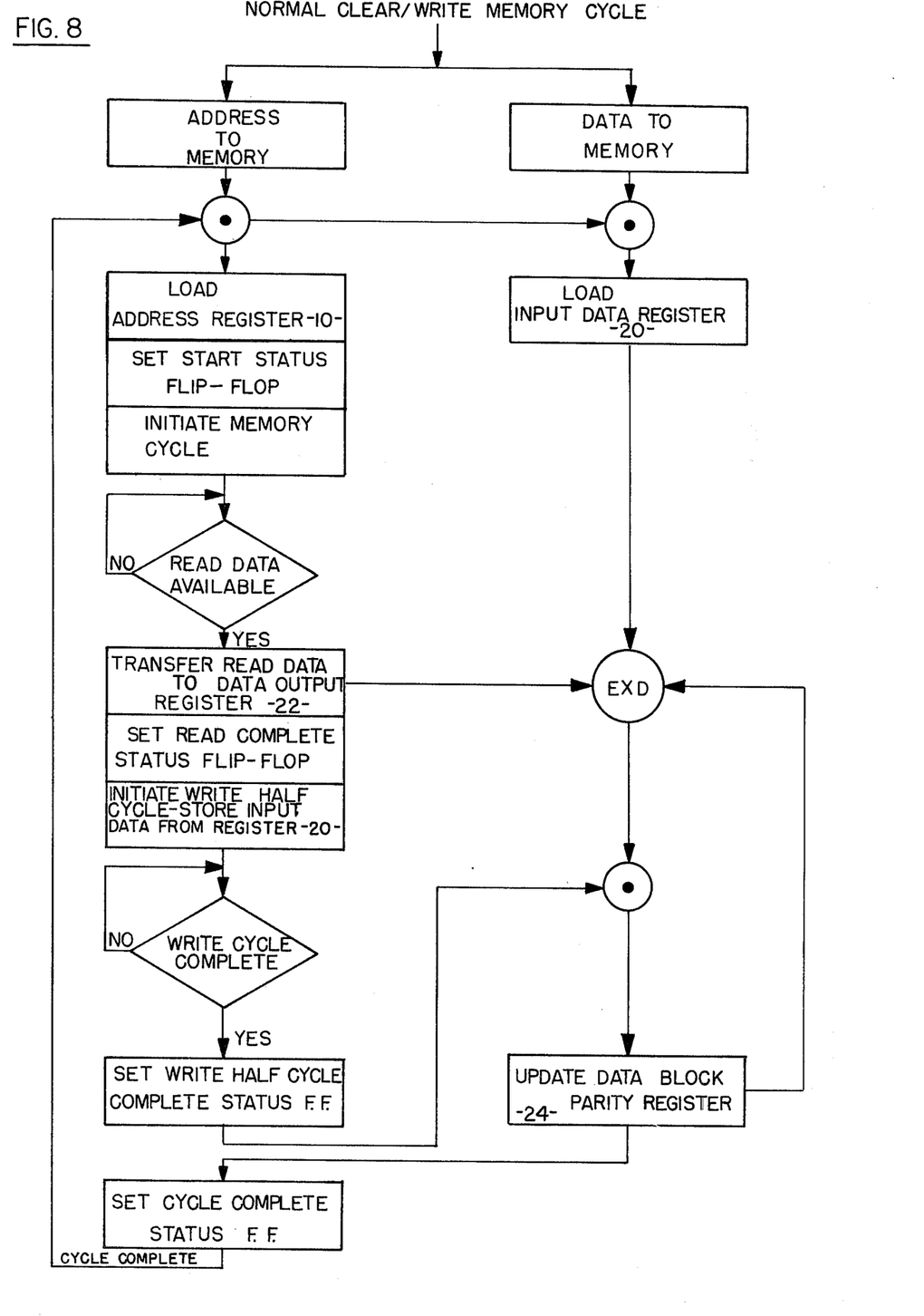
Figure 9:
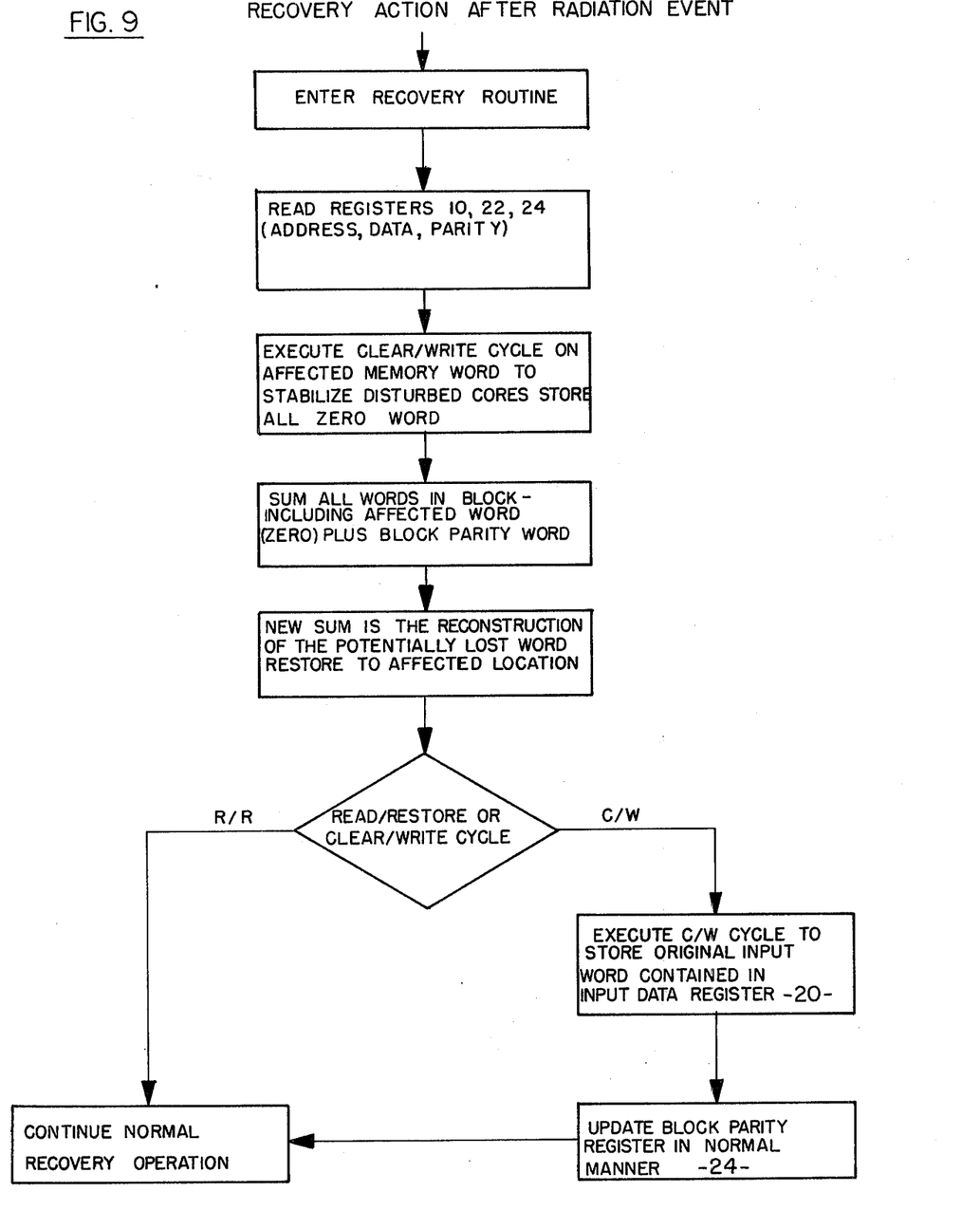

Actual memory cycle execution in conjunction with the system of FIG. 6 is best illustrated in the flow diagram of FIG. 7 for a read/restore memory cycle, and in the flow diagram of FIG. 8 for a clear/write memory cycle. The recovery operation is depicted in the flow diagram of FIG. 9. The flow diagrams show the full approach to the mechanization of the error recovery technique by the system of FIG. 6.

Figures 10, 11:
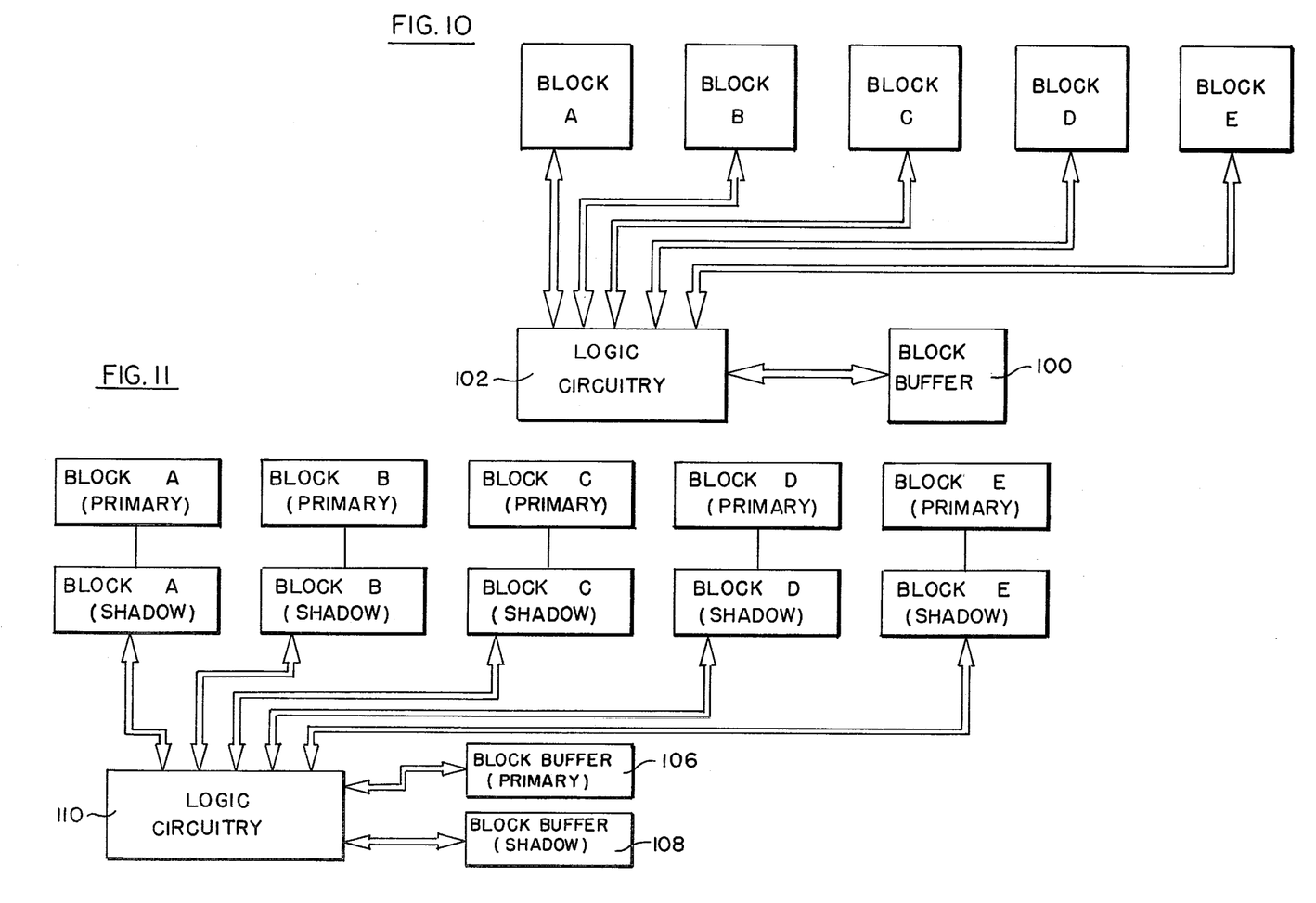
FIG. 10 is a block diagram of a further embodiment of the invention, as applied to a plated wire random access memory system for reconstituting a variable data word which may be affected during a nuclear radiation event.
FIG. 11 is a block diagram of a further embodiment of the invention for reconstituting a variable data word, as applied to a random access core memory.

Variable data word recovery is possible with respect to the random access memories without the production and use of error correction words, such as was the case in the systems of FIGS. 5 and 6. FIG. 10 illustrates a system for protecting a plated wire random access memory during write operations, and FIG. 11 shows a system for protecting a random access magnetic core type of system during either write or read/restore operations.

In the case of the plated wire random access memory, for example, and as shown in FIG. 10, critical variable data that must be retained in the event of a nuclear radiation event is normally partitioned, for example, into blocks within the memory, the blocks being designated here as A, B, C, D and E. A block buffer 100 is provided in the system. If the A block, for example, is to be up-dated, the contents of this block are loaded into the buffer 100, under the control of appropriate logic circuitry 102, so that the data may be redundantly stored in the buffer 100 and in the memory block A.

Now, should a nuclear event occur while block A is being up-dated, the original contents of block A are retrievable from the buffer 100. In other respects, the system operates in a manner similar to the previously described systems, and may use the circumvent circuitry of FIGS. 1 and 2. Since during the particular operation under consideration, information is being written only into the memory block A, the other memory blocks are in the read/only mode and are protected by the circumvent circuitry. It is clear that the other blocks can be up-dated in a similar manner, with each up-dating operation being preceded by the loading of the contents of the particular block in the buffer 100.

In the case of the random access magnetic core memory, it is necessary to add an additional level of independent redundant data storage, as shown in FIG. 11, in order to render the memory immune from the effects of a pulse of nuclear radiation. As shown in FIG. 11, the memory may be divided into five primary memory blocks A-E, each of which is wired to a corresponding "write only" "shadow" memory block A-E. For up-dating purposes, the contents of the particular primary memory block being up-dated are loaded into the buffer 106, as in the system of FIG. 10; and simultaneously the contents of the corresponding shadow block are loaded into the buffer 108. The particular block and its corresponding shadow block are then up-dated simultaneously. Then, as in the previously described system, should a nuclear event occur during the up-dating of any block, the original contents of the block are still retrievable from the shadow.

During normal read-out operations, data is read from the primary blocks only, and the shadow blocks are not accessed. Then, should a nuclear event occur during a read/restore cycle, the data is always retrievable by activating the corresponding shadow block after the event has terminated. The shadow or redundant memory block then performs all the above-described functions.

The shadow memory is controlled to write only during normal operation of the computer. When a read-out is requested at an address in this portion of the memory, only the primary block cycles and replies. It is therefore evident that the only data that may be corrupted during a nuclear event is that being written into both primary and shadow, or that being read from, the primary blocks. The shadow memory blocks are never read during a read cycle and, therefore, always retain their memory contents. If a nuclear event occurs, however, the output of the radiation detector is used to change the mode relationship of the two memory blocks of the affected word, so that the primary block becomes a write-only memory and the shadow block becomes the read/write memory.

In the manner described above, therefore, by adding current shunting circuitry, such as shown in FIGS. 1 and 2, to the random access destructive read-out or random access memory, it is possible to restrict any memory loss to a known address being accessed at the time of the radiation event. The accessed word in the fixed memory or program storage can be reconstituted by the use of block parity words, as described in conjunction with the system of FIG. 5. Likewise, the accessed word in the variable data portion of the memory can be reconstituted by the various systems described in FIGS. 6, 10 and 11.

The invention provides, therefore, an error correction system which permits random access magnetic core memories to achieve immunity to the effects of nuclear radiation. The system of the invention protects the unaddressed words in the memory from the effects of such radiation, and it permits potentially affected data words to be reconstructed.

It will be appreciated that although various embodiments of the invention have been shown and described, further modifications may be made. For example, the systems described herein may be adapted, in whole or in part, to many different types of memory systems, such as, plated wire, drum, and the like, providing the basic memory cell is radiation hard when not being accessed. It is intended in the following claims to cover all such modifications which come within the true spirit and scope of the invention.

What is claimed is:

1. A protective system to prevent data word losses in a random access memory in the presence of a radiation pulse from a nuclear radiation event, or the like, which memory includes a multiplicity of individual memory elements and associated selective and read/write circuitry; the combination of:

circumvent circuitry coupled to the selective and read/write circuitry for protecting all unaddressed memory elements in the memory in the event of a radiation pulse;

accessing means coupled to the memory for selectively accessing the data words in the memory at the different memory locations therein; and error correction and word recovery logic circuit means coupled to the accessing means for reconstituting the data word being accessed during the radiation pulse so as to replace such data word in the memory with a reconstituted date word.

2. The combination defined in claim 1, in which said error correction logic circuit means includes first register means coupled to the accessing means for storing the address of each data word as the same is being accessed by the accessing means, second means coupled to the accessing means for altering the data word accessed thereby causing the data word to assume a predetermined bit configuration, second register means, and further logic circuit means coupled to the accessing means for forming the reconstituted data word.

3. The combination defined in claim 1, in which said circumvention circuitry serves to limit the word lost during the nuclear radiation event to that address being accessed at the time of the radiation event.

4. The combination defined in claim 1, and which includes a circumvention and subsequent word recovery operation of the system.

5. The combination defined in claim 1, in which the memory has at least one block of multi-bit data words stored therein and which contains a particular number of data words at known memory locations, and in which the memory further has a multi-bit error correction word stored therein, in which said further logic circuit means forms a computed error correction word on all the words in the block including the altered data word and the error correction word, and in which said further logic circuit introduces the computed error correction word to the second register means for introduction into the memory of the reconstituted word to replace the altered word in the block at the memory location of the altered word.

6. The combination defined in claim 2, in which the second means causes the altered word to be composed of binary zeros.

7. The combination defined in claim 5, in which said further logic circuit means includes exclusive or logic so that the computed error correction word is the exclusive or sum of the data words in the block, including the error correction word and the altered word.

8. The combination defined in claim 5, in which said further logic circuit means forms said error correction word by a selected code which relates the entire contents of a block of memory.

9. The combination defined in claim 5, and which includes third register means coupled to the accessing means for storing each data word being accessed by the accessing means; fourth register means; and logic circuitry coupled to the accessing means to the fourth register means for up-dating the error correction word when any data word is replaced in the block by a different data word, and for inserting the up-dated error correction word into the fourth register means for introduction into the memory at the memory location of the original error correction word to replace the original error correction word.

10. The combination defined in claim 1, in which the data words are stored in a memory module in a plurality of primary blocks, each primary block being constituted by a predetermined number of data words, and in which the data words are also redundantly stored in any independent memory module in a plurality of shadow blocks, each of the shadow blocks containing the identical words of a corresponding one of the primary blocks, and further logic circuitry for introducing data into a primary block and its corresponding shadow block simultaneously during a write up-dating cycle for any particular word in the primary block, causing the particular word in the primary block and in the shadow block to be replaced by an up-dated data word and for causing the accessing means to access only the primary blocks to derive a particular word therefrom during a read cycle.

11. A protective system for preventing data word losses in the presence of a nuclear radiation event, or the like, while a memory is being accessed, said memory having at least one block of multi-bit data words stored therein, said block containing a particular number of data words at known memory locations, and said memory further including a multi-bit error correction word in said system including:

means coupled to the member for accessing the multi-bit data words in the block of the different memory locations;

first register means coupled to the accessing means for storing the address of each data word as the same is being accessed by the accessing means;

second means coupled to the accessing means for altering the data word assessed thereby causing the data word to assume a predetermined bit configuration;

second register means;

logic circuit means coupled to the accessing means for forming a computed error correction word on all the words in the block including the altered data word and the error correction word, and for introducing the computed error correction word to the second register means for introduction into the memory to replace the altered word in the block at the memory location of the altered word; and nuclear radiation detection means for initiating the operation of the system.

12. The protective system defined in claim 11, in which said second means causes the altered word to be composed of binary zeros.

13. The protective system defined in claim 11, in which said logic means includes exclusive or logic so that the computed error correction word is the exclusive or sum of the data words in the block including the error correction word and the altered word.

14. The protective system defined in claim 11, and which includes third register means coupled to the accessing means for storing each data word being accessed by the accessing means; fourth register means; and further logic circuitry coupled to the accessing means and to the third register means for up-dating the error correction word when any data word is replaced in the block by a different data word, and for inserting the up-dated error correction word into the fourth register means for the introduction of the up-dated error correction word into the memory to replace the original error correction word at the memory location of the original error correction word.

15. The protective system defined in claim 14, in which said third register means includes a data input register for storing the up-dated data word and a data output register for storing the original data word during such accessing operation, and in which said further logic circuitry includes correction code generation logic responsive to the contents of the input and output data register and to the original error correction word to introduce the up-dated error correction word to the fourth register means.

16. A protective system to prevent data word losses in a memory in the presence of a nuclear event, or the like, the data words being stored in the memory in a primary memory module, and said data words being further stored in the memory in an independent shadow memory module, each shadow module containing data words identical to the words contained in a corresponding primary module, said system including:

accessing means coupled to the memory for selectively accessing the data words in the memory at the different memory locations therein;

logic circuitry for introducing data during a write/update operation of any particular word in the primary block and for simultaneously causing the particular word in the primary block and in the shadow block in the memory to be replaced by the up-date word, and for causing the accessing means to access only the primary block of any such pair during a normal read operation; and control means for causing said accessing means to access the primary block during read operation prior to a nuclear event, and to access a shodow block only during the read operations following the nuclear event, said control means effectively reversing the functions of the primary and shadow blocks.

* * * * *